US006834378B2

(12) United States Patent
Augsburg et al.

(10) Patent No.: US 6,834,378 B2
(45) Date of Patent: Dec. 21, 2004

(54) SYSTEM ON A CHIP BUS WITH AUTOMATIC PIPELINE STAGE INSERTION FOR TIMING CLOSURE

(75) Inventors: Victor Roberts Augsburg, Cary, NC (US); James Norris Dieffenderfer, Apex, NC (US); Bernard Charles Drerup, Austin, TX (US); Richard Gerard Hofmann, Apex, NC (US); Thomas Andrew Sartorius, Raleigh, NC (US); Barry Joe Wolford, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 205 days.

(21) Appl. No.: 10/264,162

(22) Filed: Oct. 3, 2002

(65) Prior Publication Data

US 2004/0068707 A1 Apr. 8, 2004

(51) Int. Cl.[7] ............................. G06F 9/45; G06F 17/50
(52) U.S. Cl. .................................. 716/6; 716/10; 716/1
(58) Field of Search ............................... 716/1–2, 6–11

(56) References Cited

U.S. PATENT DOCUMENTS

| | | | | |
|---|---|---|---|---|
| 5,133,069 A | * | 7/1992 | Asato et al. ................. 713/401 |
| 5,212,782 A | * | 5/1993 | Asato et al. .................... 716/6 |
| 5,572,714 A | * | 11/1996 | Nakakura .................... 713/500 |
| 6,601,126 B1 | * | 7/2003 | Zaidi et al. ................. 710/305 |
| 2004/0010652 A1 | * | 1/2004 | Adams et al. ............... 710/313 |

OTHER PUBLICATIONS

R. Hofmann et al., "Next Generation CoreConnect™ Processor Local Bus Architecture," 15th Annucal IEEE Int'l ASIC/SOC Conference, Sep. 2002, pp. 221–225.*
K.K. Ryu et al., "A Comparison of Five Different Multiprocessor SoC Bus Architectures," Proceesings Euromicro Symposium on Digital Systems, Design, Sep. 2001, pp. 202–209.*

* cited by examiner

Primary Examiner—Leigh M. Garbowski
(74) Attorney, Agent, or Firm—Robert M. Carwell; Dillon & Yudell LLP

(57) ABSTRACT

A method of designing a system on a chip (SoC) to operate with varying latencies and frequencies. A layout of the chip is designed with specific placement of devices, including a bus controller, initiator, and target devices. The time for a signal to propagate from a source device to a destination device is determined relative to a default propagation time. A pipeline stage is then inserted into a bus path between said source device and destination device for each additional time the signal takes to propagate. Each device (i.e., initiators, targets, and bus controller) is designed with logic to control a protocol that functions with a variety of response latencies. With the additional logic, the devices do not need to be changed when pipeline stages are inserted in the various paths. Registers are utilized as the pipeline stages that are inserted within the paths.

11 Claims, 6 Drawing Sheets

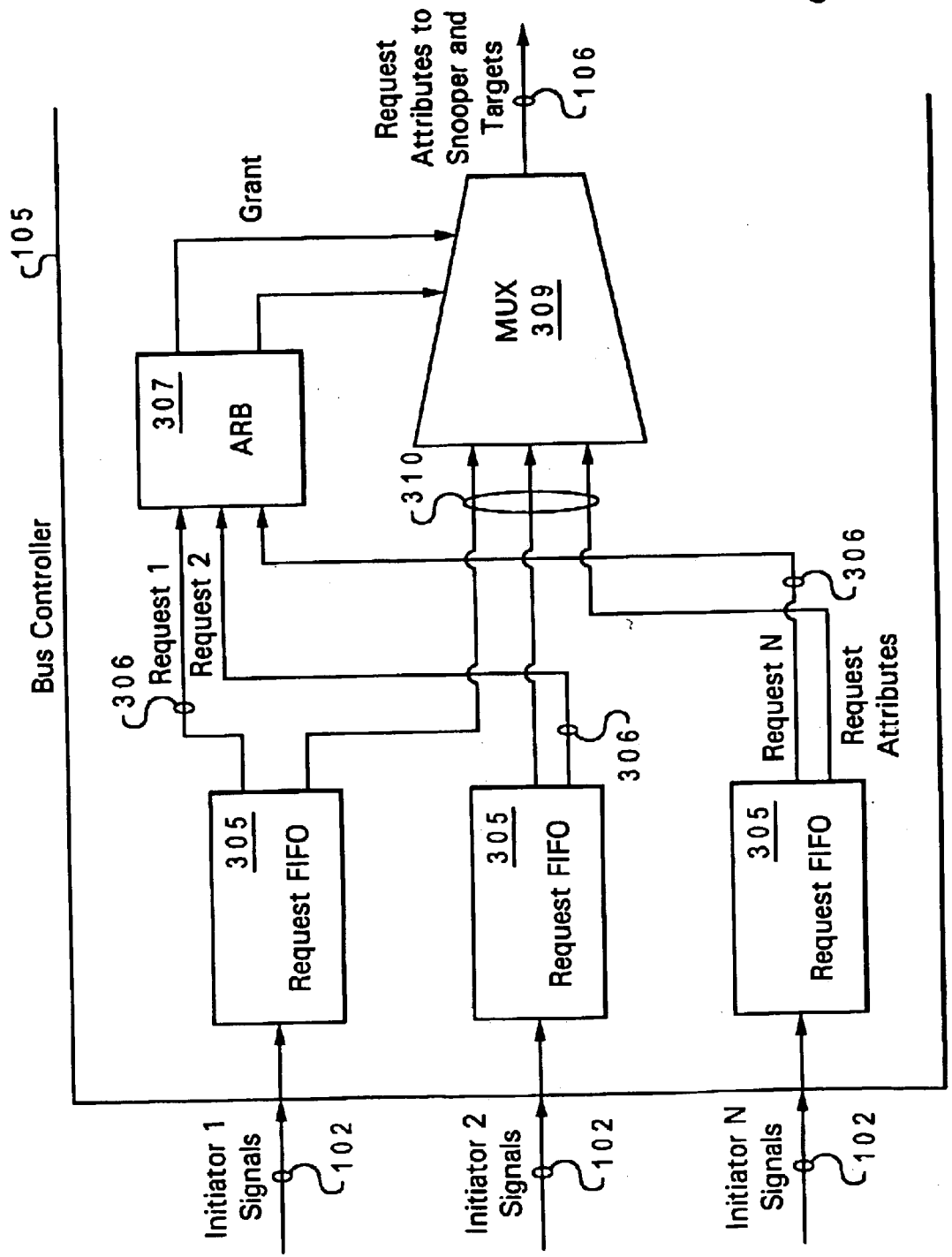

SYSTEM ON A CHIP BUS WITH AUTOMATIC PIPELINE STAGE INSERTION FOR TIMING CLOSURE

BACKGROUND OF THE INVENTION

1. Technical Field

The present invention relates generally to computer systems and in particular to a computer system designed as a system on a chip (SoC). Still more particularly, the present invention relates to a method and system for providing a SoC with bus architecture that supports sequences with varying latency and/or frequency requirements.

2. Description of the Related Art

The computer industry has made significant developments in integrated circuit (IC) technology in recent years. For example, ASIC (application specific integrated circuit) technology has evolved from a chip-set philosophy to an embedded core based system-on-a-chip (SoC) concept. The system-on-a-chip concept refers to a system in which, ideally, all the necessary integrated circuits are fabricated on a single die or substrate. An SoC IC includes various reusable functional blocks, such as microprocessors, interfaces (e.g., external bus interface), memory arrays, and DSPs (digital signal processors). Such pre-designed functional blocks are commonly called "cores".

With a SoC, processed requests are sent from a core referred to as an initiator to a target (which may also be a core). An initiator (or master or busmaster as it is sometimes called) is any device capable of generating a request and placing that request on the bus to be transmitted to a target. Thus, for example, either a processor or DMA controller may be an initiator. Targets (or slaves) are the receiving component that receives the initiator-issued requests and responds according to set protocols.

In order to complete the connections between initiators and targets, the SoC includes an on-chip bus utilized to connect multiple initiators and targets. The system bus consists of an interface to the initiators and a separate interface to the targets and logic between the interfaces. The logic between the interfaces is called a "bus controller". This configuration is typical among system-on-a-chip (SoC) buses, where all the initiators, targets and the bus controller are on the same chip (die).

One example of the bus utilized by SoC computers systems is the CoreConnect™ processor local bus (PLB). (CoreConnect™ is a registered trademark of International Business Machines). In an SoC with a PLB architecture, each device attaches to a central resource called the "PLB Macro". The "PLB Macro" is a block of logic that acts as the bus controller, interconnecting all the devices (including initiators and targets) of the SoC. PLB Macro primarily includes arbitration function, routing logic, buffering and registering logic. The devices communicate over the bus via a (PLB) protocol in a synchronous manner. The protocol includes rules that control how transmission processes are to be completed, including, for example, the number of clocks (system clock cycles) taken to perform certain sequences. Among these sequences are (1) the time from request at the initiating device to snoop result at the initiating device, and (2) the time from read data at the source device (the target) to read data at the destination device (the initiator), etc.

SoC fabrication involves various design considerations that enables differentiation among the resulting chips. Each chip is designed/fabricated with a set of devices, which may be different from (or similar to) the devices utilized by another chip. When each chip has a unique set of devices, the resulting chip/die sizes are different. Furthermore, chips may be built from a variety of chip technologies, which have different timing characteristics.

The time for a signal to propagate across a chip depends on the "distance" the signal must travel and the characteristics of the chip technology. As utilized herein, the term "distance" is a generalized term describing the combined effects of actual wire distance, wire dimensions, net capacitance, gate characteristics, etc. As a consequence, the amount of time for a signal to propagate from one device to another (including the time to propagate between a device and the PLB Macro) differs significantly from chip to chip. These inevitable variations in "distance" between devices means that (1) running the bus at a single frequency and (2) operating the protocol sequences at a single latency is not optimal for a variety of chips.

Currently, the simplest method of addressing the above problem is to define a protocol with a fixed set of latencies and then adjust the frequency based on the distances between devices. In this method the various sequences that make up the protocol are actually run at more than one latency. This method is utilized in CoreConnect™ PLB3 and PLB4. However several drawbacks are seen with this method, including:

(1) the devices must be capable of operating over a variety of frequencies. This is often problematic, particularly for devices that attach to other off-chip devices that operate at a fixed frequency;

(2) at lower frequencies, bandwidth and latency are degraded, which results in a loss of performance. The latency loss is the result of sequences taking a fixed number of clocks (ticks or cycles), while the clock ticks are becoming longer; and (3) the system (collection of devices) is "optimized" for the longest (slowest) path among the devices. Therefore, devices cannot operate at a higher frequency.

A more sophisticated method of addressing the problem involves defining the bus protocol such that protocol sequences are allowed to take a range of number of clock ticks (latencies). During chip integration (i.e., the design process of connecting all the devices on the die), the maximum distances between devices is determined, and the appropriate latencies are set for the corresponding paths.

Often, this technique is utilized such that the latency for all devices is set based on the longest path between any two devices. Thus, even nearby devices utilize the latency associated with the longest path. The CoreConnect PLB3 and PLB4 buses also utilize this technique for the master-request-to-slave-request path. However, this technique is also not optimal for many chips. Paths that are long are set to take multiple clocks for propagation, and this results in the following drawbacks:

(1) bandwidth is degraded because a new sequence cannot begin on each clock;

(2) timing analysis is more difficult to perform when paths require more than one clock for propagation. This is because timing analysis software tools require the operator to identify and specify the number of clocks associated with any path that requires more than one clock, since the default number of clocks is one; and (3) if all paths are set to a latency based on the single longest path, then devices that are close to one another cannot take advantage of their proximity.

The present invention recognizes the flaws in the two design methods described above and realizes that it would be desirable to provide a SoC designed to optimize the transmission of signals on the bus given the multiplicity of frequencies and latencies of propagation. The invention recognizes that it would be further desirable to provides this feature without requiring degradation in either timing or other parameter of SoC bus operation. These and other benefits are provided by the invention described herein.

SUMMARY OF THE INVENTION

Disclosed is a method of designing a system on a chip (SoC) to operate with varying latencies and frequencies. A layout of the chip is designed with specific placement of devices, including a bus controller, initiator, and target devices. The time for a signal to propagate from a source device to a destination device is determined relative to a default propagation time. A pipeline stage is then inserted into a bus path between said source device and destination device for each additional time the signal takes to propagate. Each device (i.e., initiators, targets, and bus controller) is designed with logic to control a protocol that functions with a variety of response latencies. With the additional logic, the devices do not need to be changed when pipeline stages are inserted in the various paths.

In the described embodiment, the bus controller is a PLB5 macro with associated PLB5 operating protocol and the default propagation time is one clock cycle. Registers are utilized as the pipeline stages that are inserted within the paths. One aspect of the design involves an algorithm that first identifies a signal that does not meet a default timing requirement of the SoC operating parameters. That signal has a corresponding group of related signals to complete an operation and the other signals within the group are identified as well. Pipeline stages are inserted as necessary in the paths of signals within the group. In some instances, a pipeline stage is also inserted within the PLB5 Macro.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein:

FIG. 2 is a block diagram of a bus controller of the SoC of FIG. 1, which controller handles the request grants, signal routing and other features according to one implementation of the invention;

DETAILED DESCRIPTION OF AN ILLUSTRATIVE EMBODIMENT

The present invention provides a novel method and system for providing support for a bus protocol designed to handle a variety of latencies and clocks during transmission of a bus. The invention provides a novel method and system for use during chip design and integration that enables the bus to operate efficiently while supporting multiple frequencies and latencies without the drawbacks inherent in current systems (e.g., setting all paths to a latency based on the longest path even for neighboring devices, etc.).

The invention is implemented in computer systems that consist of multiple devices including at least one initiator and a target interconnected via a system bus, where data is transferred between the devices over the system bus. The system bus consists of an interface to the initiators and a separate interface to the targets and logic between the interfaces. The logic between the interfaces is referred to herein as a "bus controller".

Figure 1:
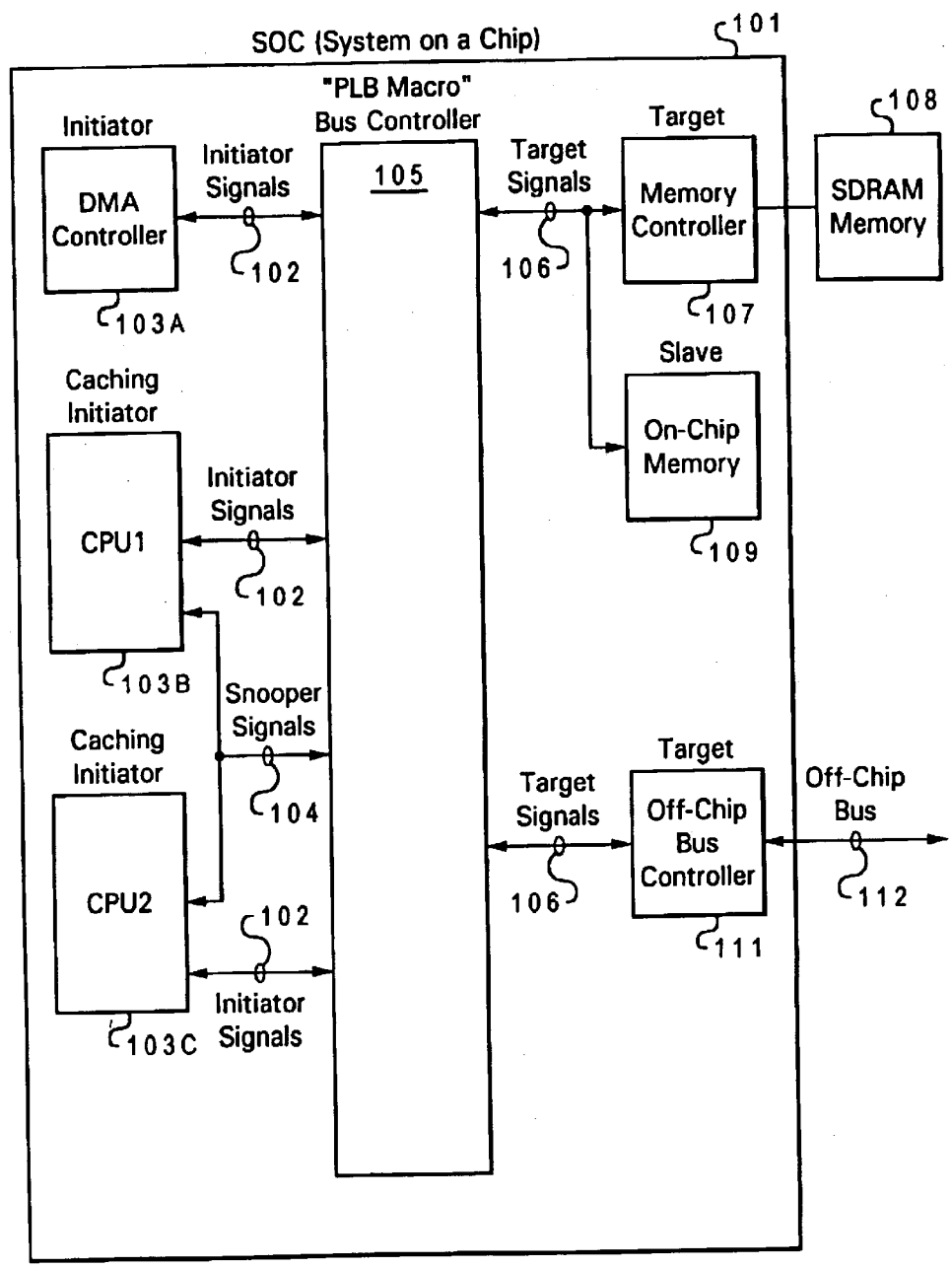
FIG. 1 is a block diagram illustrating major components of a system on a chip (SoC) within which the features of the present invention may advantageously be implemented.

In the illustrative embodiment, the computer system is a system-on-a-chip (SoC) having a PLB5 bus and PLB5 macro. FIG. 1 illustrates a SoC in which the features of the invention may be implemented. SoC 101 comprises several initiators, targets and the bus controller, all fabricated on the same chip (die).

As shown, initiators include direct memory access (DMA) controller 103A and two embedded processor cores, CPU1 103B and CPU2 103C. Generated initiator signals 102 are connected to processor local bus (PLB) controller (PLB Macro) 105, which arbitrates and connects target signals 106 to their respective destination target. As shown, the destination target is one of a memory controller (target) 107, which is coupled to and controls access to off-chip (i.e., external to SoC) SDRAM memory 108 (synchronous dynamic random access memory), an on-chip memory 109, or an off-chip controller 111. The latter target 111 has an associated off chip bus 112 by which it connects to off-chip components.

FIG. 2 illustrates several internal components of a bus controller, namely PLB5 Macro, within which the routing and interconnecting features of the invention are implemented. Bus controller 105 consists of multiple First-In-First-Out (FIFO) request queues 305, which each receive a corresponding initiator input signal 102. There is one request queue for each initiator. Request queues 305 consist of several sequential registers/blocks (not shown) that each temporarily stores a request received from the corresponding initiator. The request remains within the request queue 305 until all request ahead of it in the request FIFO are granted. The FIFO structure of the request queue ensures that the transaction ordering intended by the initiator is maintained. Bus controller 105 also includes an arbiter 307 and a multiplexer 309. Bus controller 105 further includes routing logic and miscellaneous buffering and registering logic (not shown). Request FIFO 305 issues requests 306 to arbiter 307 in the order the requests were received from the initiator, which is also the order of placement within the request queue 305.

Each request queue sends its output (the oldest request) to arbiter 307. Arbiter 307 selects which request is "granted" from among the pending requests from each of the request queues 305. Multiplexer 309 receives the request selected by arbiter 307 and also an input of request attributes 310 and generates a single output 106, which includes the request attributes. This output 106 is connected to snoopers and targets. When a request is "granted", it is broadcasted to the snoopers and the targets via output 106.

The present invention includes specific bus protocol characteristics for routing signals/data from initiators to targets, etc., via a PLB5 bus and bus controller. The invention provides an bus-routing evaluation code applied during chip design and integration to overcome the drawbacks associated with the methods described in the background art for handling multiple frequencies and latencies of original propagation between devices. In the illustrative embodiment, several features of the invention are supported via CoreConnect™ PLB5 protocol.

Accordingly, CoreConnect™ PLB5 protocol is defined to require all devices to tolerate a range of latencies (possibly an indefinitely large range of latencies) for all responses, and PLB5 protocol optionally supports different latencies for different devices. In the illustrative embodiment, each device (i.e., initiators, targets, and bus controller) is designed with logic to control a protocol that functions with a variety of response latencies. With the additional logic, the devices do not need to be changed when pipeline stages are inserted in the various paths. The varying latency characteristic is straightforward for operations involving (1) request and requestAck sequences and (2) request and read data sequences. For example, one of PLB5 protocol's rule for a master (i.e., initiator of requests) is that the time from "request" to "requestAck" is one or more clocks, indicating the possibility of multiple clocks.

With a write data sequence, PLB5 protocol is more complicated. Typical bus protocols requires that the recipient (target) of write data assert a "WriteDataAck" signal upon accepting write data. The "WriteDataAck" signal causes the provider (e.g., master) of the write data to advance to the next write data bus value. However, if the path for the WriteDataAck signal (or the write data bus) exceeds one clock, then optimal use of the write data bus is not achieved (the write data request takes two or more clocks for each new write data to be placed on the bus value) or else the write data request requires the recipient to assert WriteDataAck for data it has not yet received.

PLB5 includes a similar base implementation as that described above with significant modifications to the overall transmission operation metrics and chip integration procedure. Specifically, according to the invention, the recipient (target) of write data asserts "sl_wrDGrant" only once for all write data associated with a request, and the recipient must accept all the write data on adjacent clocks. For write data associated with multiple requests, the recipient (target) can assert sl_wrDGrant multiple times before write data arrives. That is, the assertion of sl_wrDGrant is pipelined from the target to indicate that it is receiving the write data even before it actually receives all of the write data.

The invention also finds applicability when a subset of the responses occur at a fixed latency, rather than all of the responses in a range of latencies. In these implementations, however, this subset of corresponding paths would not benefit from the flexibility of the invention.

According to the invention, the PLB5 protocol is also defined so that key sequences may overlap. To accomplish this feature, protocol sequences are signaled by pulsing an appropriate control signal active for exactly one clock. Thus, multiple sequences can be signaled (request, acknowledgments, etc., begun) on adjacent clocks. For example, an initiator may start a request "A" on clock one and a request "B" on clock two. The initiator then receives a response to "A" on clock four and a response to "B" on clock five. This protocol characteristic means that paths that are more than one clock in length are "pipelined" by having an additional register for each signal for each additional clock. For example, a path that takes four clocks to propagate has three registers between the source and the destination for each signal.

FIG. 3 illustrates this bus configuration with registers placed within the path connecting a initiator (or master) with a target. Specifically shown is a subset of the connections between an Initiator, the PLB5 Macro and a Target. According to the illustrative embodiment, initiator 303 is connected to target 307 with I_request signal 302 traveling out from initiator 303 to target 307 and I_requestAck signal 304 traveling back from target 307 to initiator 303. Both paths travel through PLB macro 105. Along both paths (i.e., I_request signal 302 and I_requestAck signal 304) are two sequences of four registers 306, 308, respectively. Because initiator 303 is fairly "far" from PLB5 macro 105, two pipeline stages (i.e., register bits on the request and requestAck signals) are added between initiator 301 and PLB5 macro 105. One of the four pipeline stages for both I_request and I_requestAck signals 302, 304 is within PLB5 Macro 105 itself. However, target 307 is not as far away from PLB5 macro 105, so only one pipeline state are added between the target 307 and PLB5 macro 105. Also illustrated is clock signal 311, which is input to each register 306, 308.

As described above, the number of registers within a path corresponds to the number of clock cycles required for the propagation of the signal less 1. For example, if the request requires 3 clock cycles to complete, 2 registers are required within the I-request path. Likewise if the request acknowledgment requires 8 clock cycles to complete, 7 registers are required and placed within the request acknowledge path. The number of registers is decreased by 1 since it is assumed that the default number of clock cycles is 1. Changing the default number of clock cycles would necessarily change the number of registers accordingly.

Figure 5:
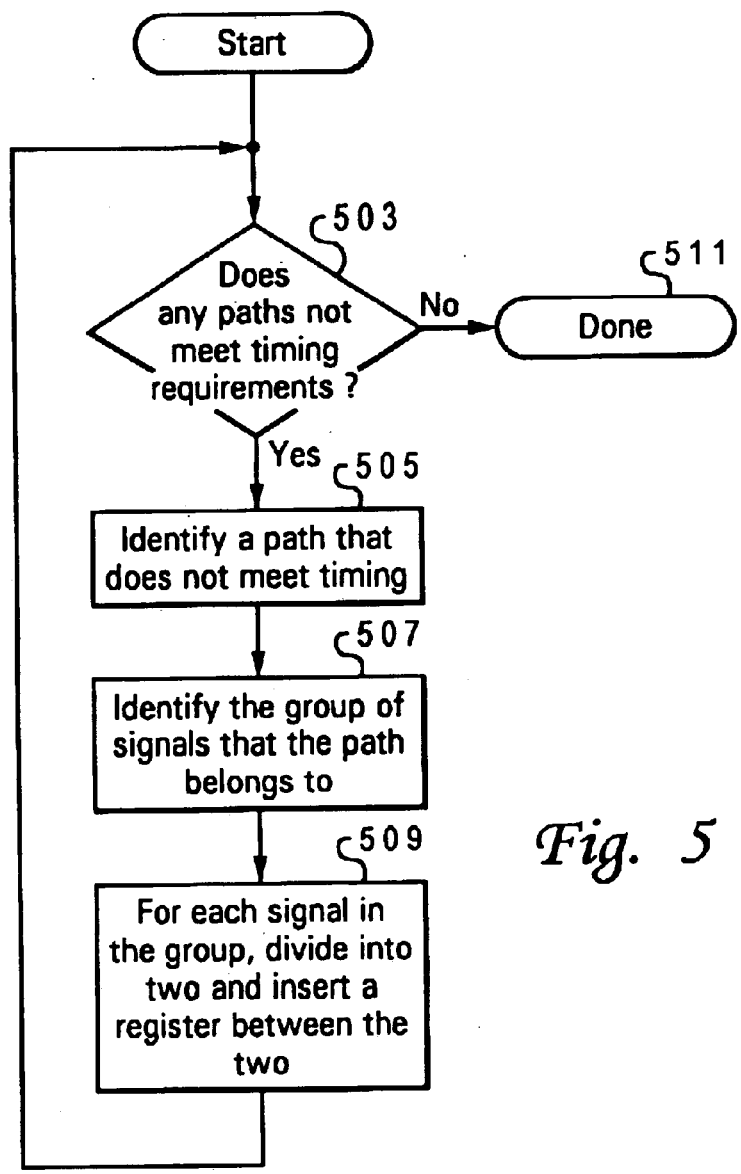
FIG. 5 is a flow chart of the process steps of determining when to provide registers for a transmission path between a master and target on a bus of the SoC according to one implementation of the present invention.

In order to evaluate the number of registers required in a path during the chip integration process, the chip integrator applies the following process illustrated by the process blocks of FIG. 5. FIG. 5 provides a flowchart of the processes followed during chip integration to insert the pipeline stages until the desired timing requirements are met for each path. The process begins at block 503, at which a determination is made whether there are paths within the design that do not meet the desired timing requirements of the system. This determination leads to an identification of a path that is too long to meet timing at the specified frequency as shown at block 505. Then, the "group" of signals associated with the path that is too long is also identified as shown at block 507.

Signal "groups" are determined based on protocol sequences where multiple signals are used to indicate a particular feature of functionality. More specifically, a signal group is a control signal or set of control signals that are all signaled together (or at a predefined set of times) along with their associated data bus or transfer qualifier signals. For example, a signal called "Read DataAck" may be asserted on the same clock as all the elements of "readDataBus [0:127]". Thus, ReadDataAck and Read DataBus[0:127] are a "group".

Returning to FIG. 5, following the identification of the signal group, a pipeline state (i.e., a set of registers) is added to all signals of the group containing the path that is too long, as indicated at block 509. The process is then repeated for all signals within the chip as indicated by the decision at block 503. Once all the signals and corresponding groups have been identified and required registers added to the paths, the process ends, as shown at block 511. In one embodiment, the process is automatically applied by a software tool.

Thus, additional pipeline stages are added between devices (e.g., included between a device and the PLB Macro) and within the PLB Macro as needed to meet frequency and latency requirements of the system and the devices. PLB5 protocol is defined such that the protocol works regardless of the number of pipeline stages added between devices. Thus, the invention allows all devices to be designed to a single frequency. The invention further provides that the single frequency can always be achieved on the bus regardless of the size of the chip die or the chip technology. Finally, the invention enables the frequency to always retain the same peak bandwidth capabilities.

Figure 4:
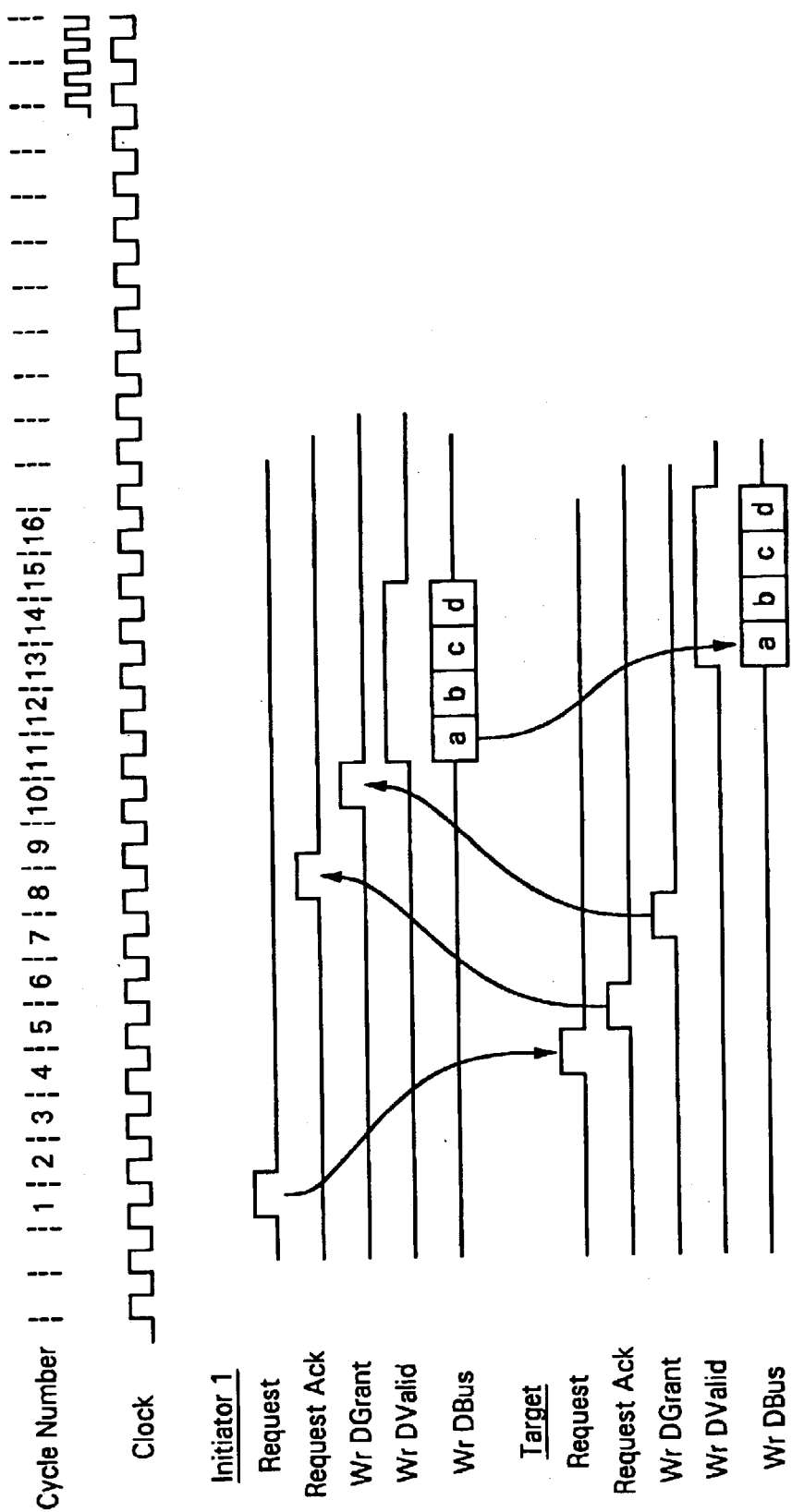
FIG. 4 is a timing diagram indicating the clock cycles utilized for transmitting signals on the bus according to another illustrative embodiment of the invention.

FIG. 4 is a timing diagram illustrating clock time characteristics for a bus protocol and system design that tolerates a range of latencies for the request and write data buses, as discussed above. The clock cycles are shown at the top of the diagram in sequential order. At cycle 1, the initiator makes a request. The request encounters three clock delays on its way to the target, and thus the request arrives in cycle 4. The target responds with requestAck in cycle 5, which encounters two clock delays on its way back to the initiator. The requestAck arrives at the initiator in cycle 8.

The target also responds to the request with wrDGrant in cycle 7, which indicates that the target is ready to receive write data. The wrDGrant signal encounters two clock delays on its way to the initiator, and the wrDGrant signal arrives at the initiator in cycle 10. When the initiator samples wrDGrant active, the initiator sends write data on the next four clock cycles (cycles 11, 12, 13, 14). Here the request is assumed to have a length of four data beats. The initiator also asserts wrDValid for the same four clock cycles to indicate that data is being sent. The write data and the assertion of wrDValid arrive at the target in cycles 13, 14, 15 and 16.

Figure 3A:
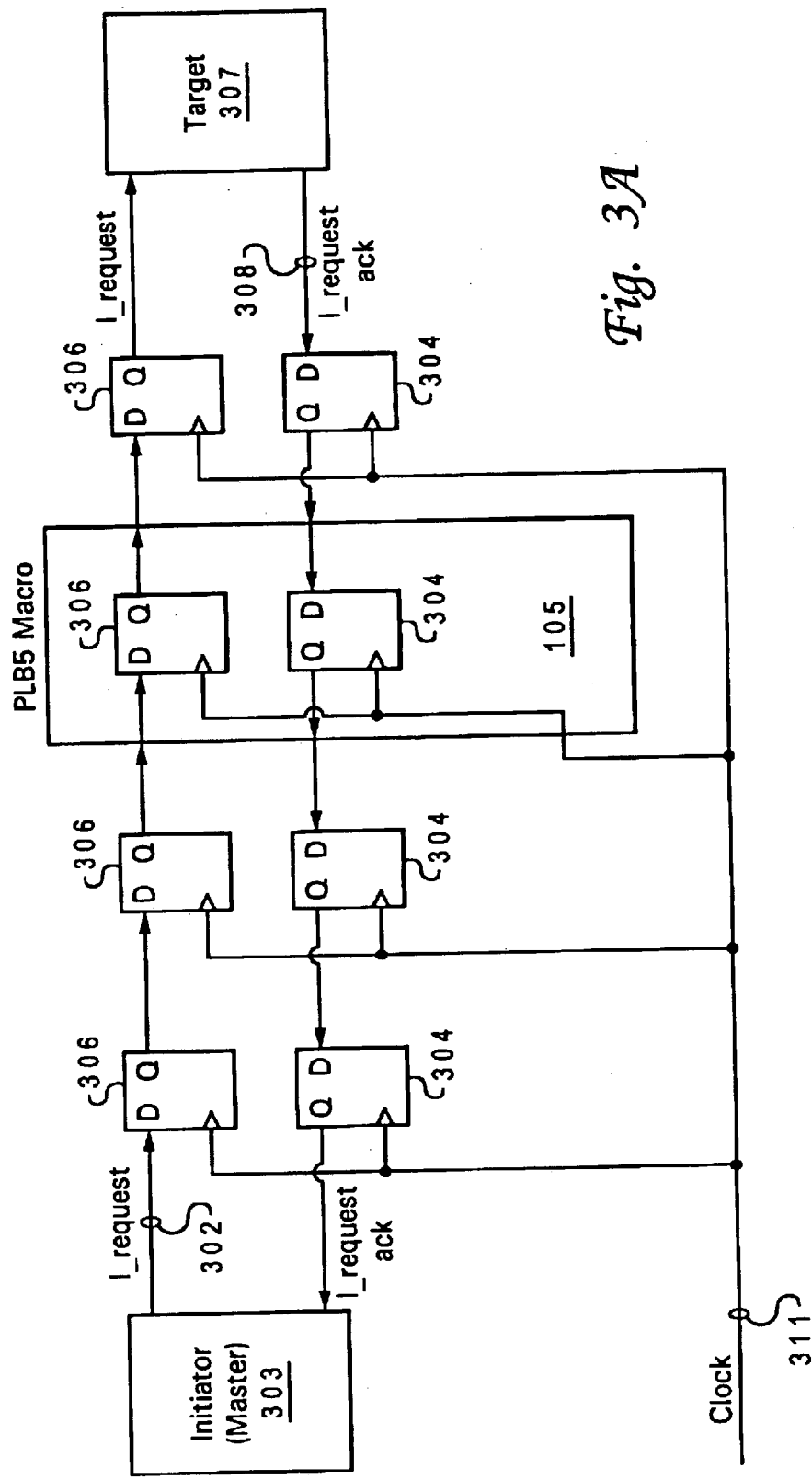
FIG. 3A illustrates the bus connectivity between an initiator and target via a PLB macro including the additional clock registers for normalizing bus operations according to one illustrative embodiment of the present invention.
Figure 3B:
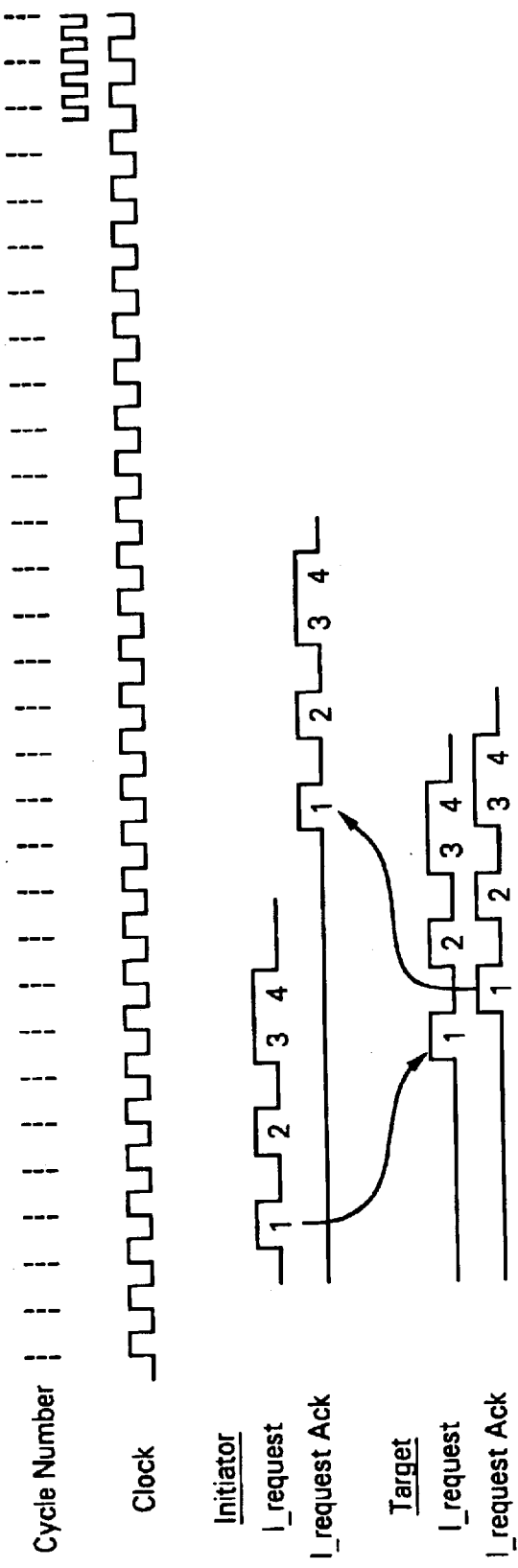
FIG. 3B is a timing diagram indicating the clock cycles utilized for transmitting signals on the bus designed as shown in FIG. 3A according to one illustrative embodiment of the invention.

FIG. 3B is a timing diagram illustrating the request and requestAck signals propagating between an Initiator and a Target with four pipeline stages between them, according to bus configuration illustrated in FIG. 3A. The waveform of FIG. 3B also demonstrates the protocol's principle of overlapping sequences. As illustrated, requests 1, 2, 3 and 4 are all launched from the Initiator before requestAck is received for any of the requests. This overlapping allows the bandwidth to remain constant regardless of the number of pipeline stages inserted between the Initiator and the Target.

As a final matter, it is important that while an illustrative embodiment of the present invention has been, and will continue to be, described in the context of a fully functional data processing system, those skilled in the art will appreciate that the software aspects of an illustrative embodiment of the present invention are capable of being distributed as a program product in a variety of forms, and that an illustrative embodiment of the present invention applies equally regardless of the particular type of signal bearing medium used to actually carry out the distribution. Examples of signal bearing media include recordable media such as floppy disks, hard disk drives, CD-ROMs, and transmission media such as digital and analog communication links.

Although the invention has been described with reference to specific embodiments, this description should not be construed in a limiting sense. Various modifications of the disclosed embodiments, as well as alternative embodiments of the invention, will become apparent to persons skilled in the art upon reference to the description of the invention. For example, although the invention is described with specific references to PLB5, PLB5 bus, PLB5 macro, and PLB5 protocol, the features of the invention are fully applicable to any bus configuration and protocol which supports various latencies and frequencies and the other functional characteristics required for the implementation of the invention. It is therefore contemplated that such modifications can be made without departing from the spirit or scope of the present invention as defined in the appended claims.

What is claimed is:

1. A method of designing a system on a chip (SoC) to operate with varying latencies and frequencies, said method comprising:

designing a layout of the chip with specific placement of devices, including a bus controller, a signal source device, and a destination device;

providing a set of said devices, which contain logic to control a protocol that functions with a plurality of latencies;

determining a time for a signal to propagate from the source device to the destination device relative to a default propagation time; and inserting a pipeline stage in a bus path between said source device and said destination device for each additional time the signal takes to propagate.

2. The method of claim 1, wherein said default propagation time is set to one clock cycle.

3. The method of claim 1, wherein said designing step comprises selecting a processor local bus (PLB)5 macro as said bus controller with associated PLB5 operating protocol.

4. The method of claim 1, wherein said pipeline stage included in said inserting step is a register.

5. The method of claim 1, wherein said source device and said destination device are respectively one of an initiator and a target.

6. The method of claim 1, further comprising:

identifying a first signal that does not meet a default timing requirement of the SoC operating parameters;

identifying other signals associated with said first signal that are required to complete a functional operation that involves said first signal; and applying said inserting step to each of said signal and said other related signals wherein necessary pipeline stages are inserted in a path of each signal.

7. The method of claim 1, further comprising inserting a pipeline stage within said bus controller within particular ones of said signal path that require an additional pipeline stage.

8. The method of claim 1, wherein said determining step comprises evaluating a plurality of metrics including distance, wire dimensions and propagation characteristics, and chip fabrication technology.

9. The method of claim 3, wherein utilization of PLB5 Macro provides additional functional features, said method further comprising:

enabling an assertion of multiple write grant responses for multiple write requests in a pipelined manner from a source (target) device to a destination (initiator) device before all of write data is received at the target; and enabling an assertion of a single write grant response for all write data associated with a single write request.

10. The method of claim 3, further comprising:

enabling an overlap of sequences by pulsing a control signal active on adjacent clock cycles for each of the protocol sequences, wherein a path that is more than one cycle in length is pipelined utilizing each register within the path for each additional clock cycle the signal takes to propagate to launch a different sequence.

11. A system on a chip designed according to claim 1.

* * * * *

UNITED STATES PATENT AND TRADEMARK OFFICE
CERTIFICATE OF CORRECTION

PATENT NO. : 6,834,378 B2
DATED : December 21, 2004
INVENTOR(S) : Augsburg et al.

It is certified that error appears in the above-identified patent and that said Letters Patent is hereby corrected as shown below:

<u>Column 4,</u>
Line 40, after "off-chip" insert -- bus --.

Signed and Sealed this

Thirteenth Day of December, 2005

JON W. DUDAS
*Director of the United States Patent and Trademark Office*